(12) United States Patent
Liew et al.

(10) Patent No.: US 6,687,133 B1
(45) Date of Patent: Feb. 3, 2004

(54) GROUND PLANE ON 2 LAYER PBGA

(75) Inventors: Wee K. Liew, San Jose, CA (US); Hong T. Lim, San Jose, CA (US); Chengyu Guo, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/295,711

(22) Filed: Nov. 15, 2002

(51) Int. Cl.$^7$ ................................................ H05K 7/10
(52) U.S. Cl. .................. 361/760; 361/777; 361/794; 361/792; 361/808; 174/51; 174/261; 257/659; 257/700; 257/780
(58) Field of Search ................................. 361/760, 777, 361/792, 794, 776, 767, 808; 257/738, 659, 664, 780, 700; 174/261, 257, 51, 78

(56) References Cited

U.S. PATENT DOCUMENTS

| | | | | | |
|---|---|---|---|---|---|
| 5,640,048 A | * | 6/1997 | Selna | ........................ | 257/738 |
| 5,835,355 A | * | 11/1998 | Dordi | ........................ | 361/760 |
| 5,864,470 A | * | 1/1999 | Shim et al. | .................. | 361/777 |
| 6,204,448 B1 | * | 3/2001 | Garland et al. | ............ | 174/52.3 |
| 6,404,067 B1 | * | 6/2002 | Singh et al. | ................ | 257/784 |
| 6,417,462 B1 | * | 7/2002 | Dabral et al. | ............... | 174/261 |

* cited by examiner

Primary Examiner—David Martin
Assistant Examiner—Hung Bui
(74) Attorney, Agent, or Firm—Trexler, Bushnell, Giangiori, Blackstone & Marr, Ltd.

(57) ABSTRACT

A two layer PBGA which includes a metal ground plane at its bottom layer. The ground plane is preferably a metal plane which is connected to ground through a metal connection to a ball pad at the center of the package and a ball pad proximate the edge of the package. The ground plane is voided around the signal and power balls, via and "dog bones". The PBGA is configured such that the ground plane serves effectively the same function as the second layer ground plane in a conventional four layer PBGA. The PBGA provides a cheaper alternative to the generally more expensive four layer PBGA, and provides better cross talk performance (especially for high frequency signaling) as well as better thermal performance as a result of having more metal at the bottom layer of the package.

3 Claims, 3 Drawing Sheets

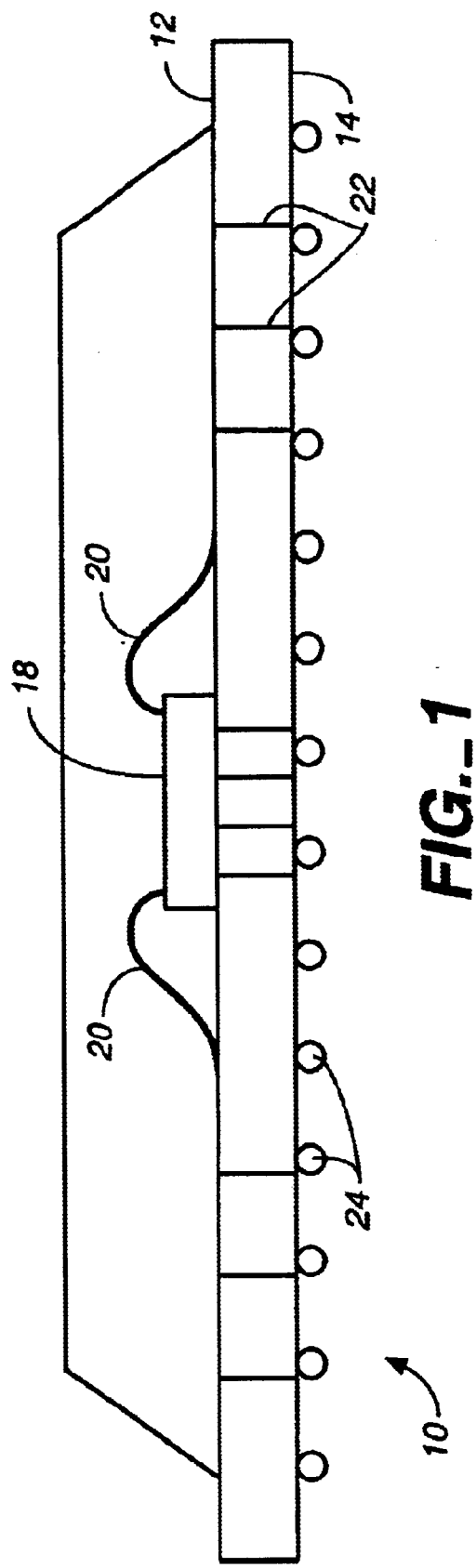
FIG._1

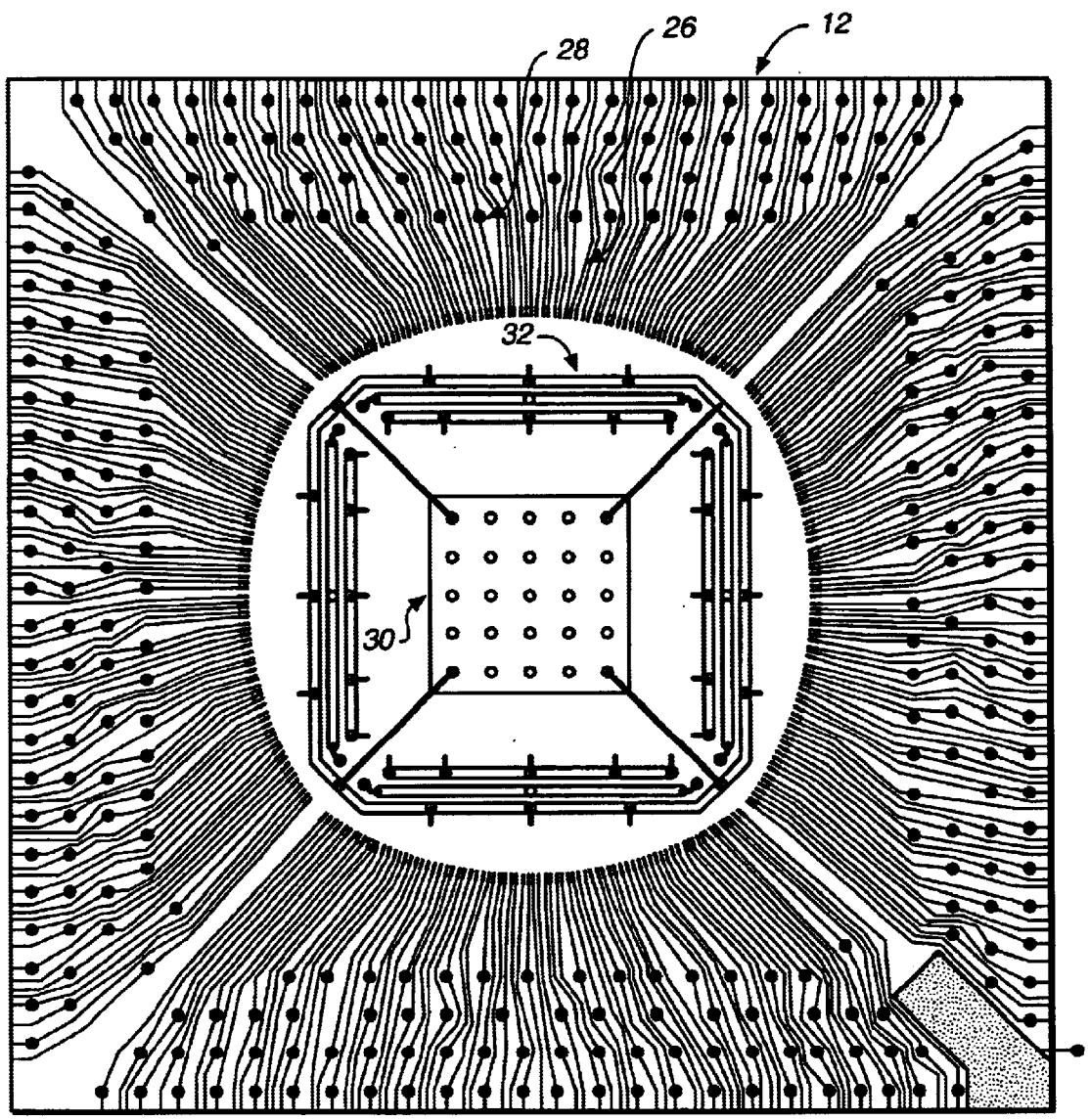
FIG._2

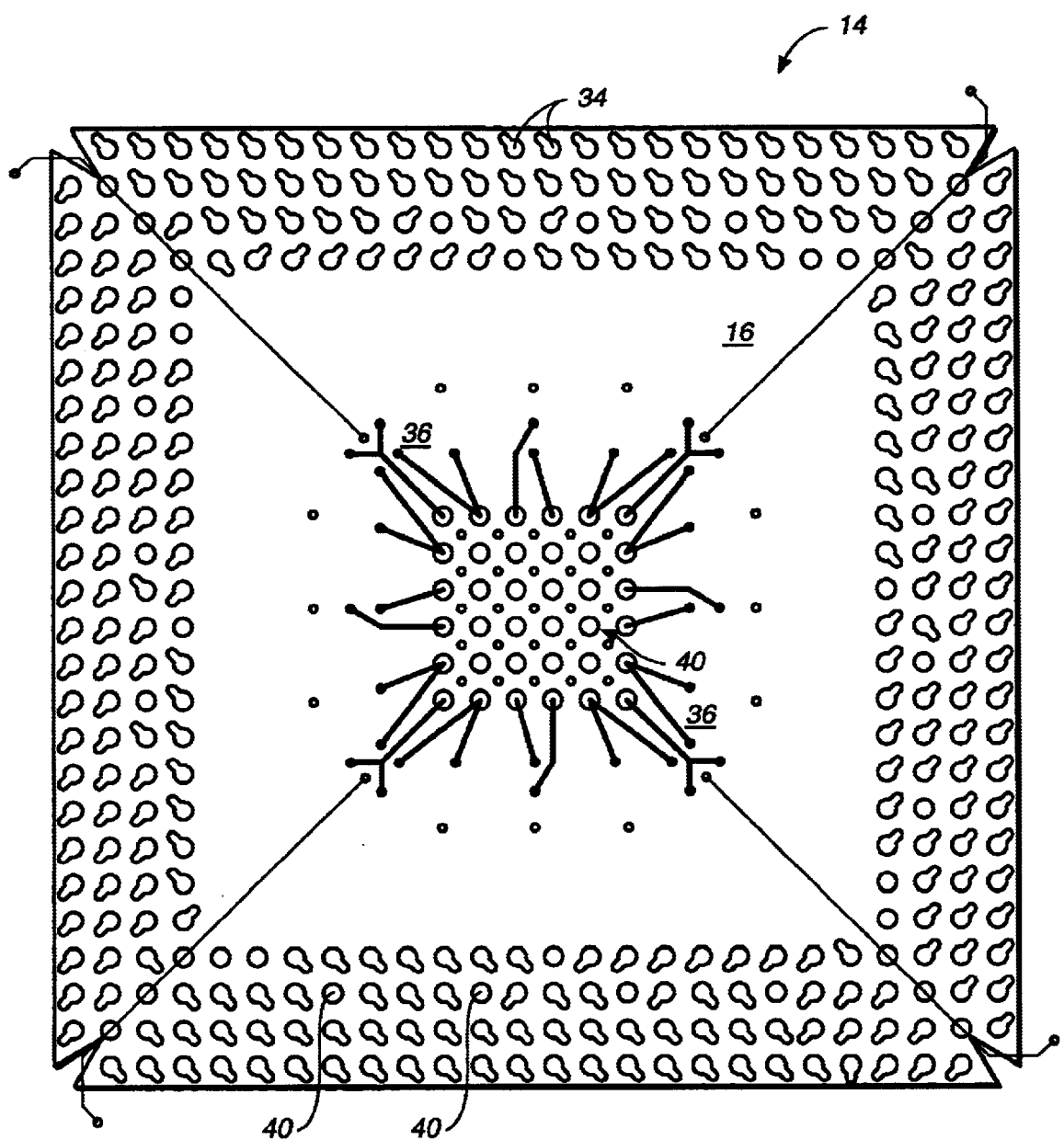
FIG._3

GROUND PLANE ON 2 LAYER PBGA

BACKGROUND

The present invention generally relates to Plastic Ball Gate Arrays (PBGA's), and more specifically relates to a new PBGA design where a ground plane is provided at the bottom layer.

One type of integrated circuit (IC) package is called a Plastic Ball Gate Array or PBGA. The major component of such a package is a substrate which is comprises of a glass epoxy laminate having a copper traces disposed thereon and having one or more vias drilled therethrough. There are two layer PBGA's as well as four layer PBGA's. Generally, two layer PBGA's have higher cross-talk noise and signal impedance compared to four layer PBGA's. Therefore, typically when there is a need for superior electrical performance, a four layer PBGA (having power and ground planes) is selected over a two layer PBGA, despite the fact that a four layer PBGA generally costs about 10 to 20 percent more than a two layer PBGA. Hence, there is a need for a two layer PBGA with improved electrical performance, such that the cheaper two layer PBGA can be chosen over the more expensive four layer PBGA in high performance applications.

OBJECT AND SUMMARY

A general object of an embodiment of the present invention is to provide a two layer PBGA which provides high electrical performance.

Briefly, and in accordance with at least one of the foregoing objects, an embodiment of the present invention provides a two layer Plastic Ball Gate Array which includes a metal ground plane at its bottom layer, preferably extending from the center of the package to its edge. The ground plane provides a return path for the signals and preferably reduces the power impedance as compared to conventional two layer PBGA's which do not include any such ground plane. The ground plane is preferably a metal plane which is connected to ground and voided around the signal and power balls, via and "dog bones" (i.e., thick traces which connect the vias to the ball pad at the bottom layer). Preferably, the plane is grounded through a metal connection to the ball pad at the center of the package and proximate the edge of the package. Preferably, the ground ball pad at the periphery is spaced apart for optimum grounding.

Preferably, the PBGA is configured such that the ground plane serves effectively the same function as the second layer ground plane in a conventional four layer PBGA. The PBGA provides a cheaper alternative to the generally more expensive four layer PBGA. An advantage of such a two layer PBGA is that it uses effectively the same technology as existing two layer PBGA's. Such a two layer PBGA preferably provides better cross talk performance (especially for high frequency signaling) as well as better thermal performance by having more metal at the bottom layer of the package.

BRIEF DESCRIPTION OF THE DRAWINGS

The organization and manner of the structure and operation of the invention, together with further objects and advantages thereof, may best be understood by reference to the following description, taken in connection with the accompanying drawing, wherein:

FIG. 1 is an enlarged side schematic view of a two layer PBGA package;

FIG. 2 is an enlarged top plan view of a top layer of the PBGA package shown in FIG. 1; and FIG. 3 is an enlarged top plan view of a bottom layer of the PBGA package shown in FIG. 1, where the bottom layer is in accordance with an embodiment of the present invention.

DESCRIPTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

A conventional two layer PBGA provides that signal traces are routed from the bond finger near the center to the periphery of the package and then land on a via which then appear on the bottom. A thick trace (often referred to as a "dogbone") connects the via to a ball pad at the bottom layer. The bottom layer has dogbones, some thick ground and power metal traces connecting the via to respective ball pads. There may be some plating tails running from via to the edge of the package. There is usually a small metal plane in the center, but the plane does not provide a return path for the signal above. As discussed above, generally two layer PBGA's have higher cross-talk noise and signal impedance compared to four layer PBGA's. Therefore, typically when there is a need for superior electrical performance, a four layer PBGA (having power and ground planes) is selected over a two layer PBGA, despite the fact that a four layer PBGA generally costs about 10 to 20 percent more than a two layer PBGA. Hence, there is a need for a two layer PBGA with improved electrical performance, such that the cheaper two layer PBGA can be chosen over the more expensive four layer PBGA in high performance applications.

FIGS. 1–3 illustrate a two layer PBGA package 10 which is in accordance with an embodiment of the present invention. Specifically, FIG. 1 provides an enlarged side schematic view of the package 10, while FIG. 2 provides an enlarged top plan view of the top layer 12 of the package and FIG. 3 provides an enlarged top plan view of the bottom layer 14 of the package. As shown in FIG. 3, the bottom layer 14 of the package 10 provides a metal ground plane 16. Preferably, the package 10 is configured such that the ground plane 16 on the bottom layer 14 serves effectively the same function as the second layer ground plane in a conventional four layer PBGA. Ideally, the two layer PBGA package 10 shown in FIGS. 1–3 provides a cheaper alternative to the generally more expensive four layer PBGA, and provides better cross talk performance (especially for high frequency signaling) as well as better thermal performance as a result of having more metal at the bottom layer of the package. The overall structure of the package 10 will now be described in more detail with reference to the FIGURES.

As shown in FIG. 1, the package 10 includes a top layer 12 and a bottom layer 14. An integrated circuit (IC) 18 is disposed on the top layer 12 and is connected thereto with wire 20. Vias 22 effectively extend between the top layer 12 and bottom layer 14 of the package 10, and solder balls 24 are disposed under the bottom layer 14. FIG. 2 depicts the top layer 12 of the package 10 in more detail. As shown, the top layer 12 includes traces 26, vias 28, an area 30 for receiving the integrated circuit (IC) 18 (see FIG. 1) and power and ground rings 32 proximate area 30.

FIG. 3 depicts the bottom layer 14 of the package 10 in more detail. As shown, the bottom layer includes a metal ground plane 16 which generally spans from the center to the edge of the package 10. As shown, the metal ground plane 16 is voided around the signal and power balls 34, vias and "dogbones" (i.e., areas such as those identified as 36 in FIG. 3), but is connected to ground through metal connection to the ground ball pads 40 at the center of the package and towards the edge of the package 10. Preferably, the ground ball pads 40 proximate the peripheral edge of the package 10 are spaced apart for optimum grounding. The metal ground plane 16 provides a return path for the signal above.

Preferably, the package 10 is configured such that the metal ground plane 16 on the bottom layer 14 of the package 10 serves effectively the same function as the second layer ground plane in a conventional four layer PBGA. The two layer PBGA package 10 shown in FIGS. 1–3 ideally provides a cheaper alternative to the generally more expensive four layer PBGA, and provides better cross talk performance (especially for high frequency signaling) as well as better thermal performance as a result of having more metal at the bottom layer of the package.

While an embodiment of the present invention is shown and described, it is envisioned that those skilled in the art may devise various modifications of the present invention without departing from the spirit and scope of the appended claims.

What is claimed is:

1. A two layer Plastic Ball Gate Array (PBGA) package comprising a top layer having an integrated circuit disposed thereon and a non-tape bottom layer, said bottom layer comprising a metal plane which is connected to ground, wherein the metal plane spans proximate a peripheral edge of the package to a center of the package, wherein the bottom layer includes signal and power balls and the metal plane is voided around the signal and power balls, wherein the metal plane is grounded through metal connections to a ball pad proximate the center of the package and to a ball pads at the peripheral edge of the package.

2. A two layer Plastic Ball Gate Array (PBGA) package as recited in claim 1, said bottom layer comprising a plurality of ground balls proximate the peripheral edge of the package, wherein said ground balls are spaced apart, thereby enhancing grounding of the metal plane.

3. A two layer Plastic Ball Gate Array (PBGA) package as recited in claim 1, wherein the metal plane on the bottom layer of the package provides a return path for the signal at the top layer of the package.

* * * * *

UNITED STATES PATENT AND TRADEMARK OFFICE
CERTIFICATE OF CORRECTION

PATENT NO.        : 6,687,133 B1
APPLICATION NO.   : 10/295711
DATED             : February 3, 2004
INVENTOR(S)       : Wee K. Liew, Hong T. Lim and Chengyu Guo It is certified that error appears in the above-identified patent and that said Letters Patent is hereby corrected as shown below:

Col. 4 lines 1-13
In the claims, delete:

"1. A two layer Plastic Ball Gate Array (PBGA) package comprising a top layer having an integrated circuit disposed thereon and a non-tape bottom layer, said bottom layer comprising a metal plane which is connected to ground, wherein the metal plane spans proximate a peripheral edge of the package to a center of the package, wherein the bottom layer includes signal and power balls and the metal plane is voided around the signal and power balls, wherein the metal plane is grounded through metal connections to a ball pad proximate the center of the package and to a ball pads at the peripheral edge of the package."

and insert:

--1. A two layer Plastic Ball Gate Array (PBGA) package comprising a top layer having an integrated circuit disposed thereon and a bottom layer, said bottom layer comprising a metal plane which is connected to ground, wherein the metal plane spans the bottom layer, extends to a periphery of the package, and provides a return path for a signal at the top layer of the package, wherein the bottom layer includes signal and power balls and the metal plane is voided around the signal and power balls, wherein the metal plane is grounded through metal connections to a ball pad proximate the center of the package and to ball pads at the peripheral edge of the package.--

Col. 4 lines 19-22
In the claims, delete:

"3. A two layer Plastic Ball Gate Array (PBGA) package as recited in claim 1, wherein the metal plane on the bottom layer of the package provides a return path for the signal at the top layer of the package."

Signed and Sealed this
First Day of February, 2011

David J. Kappos
*Director of the United States Patent and Trademark Office*